(12) United States Patent
Wang et al.

(10) Patent No.: US 8,492,736 B2
(45) Date of Patent: Jul. 23, 2013

(54) OZONE PLENUM AS UV SHUTTER OR TUNABLE UV FILTER FOR CLEANING SEMICONDUCTOR SUBSTRATES

(75) Inventors: Yen-Kun Victor Wang, Union City, CA (US); Shang-I Chou, San Jose, CA (US); Jason Augustino, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 492 days.

(21) Appl. No.: 12/797,196

(22) Filed: Jun. 9, 2010

(65) Prior Publication Data

US 2011/0306213 A1   Dec. 15, 2011

(51) Int. Cl.
*H01L 21/465* (2006.01)
*B32B 17/00* (2006.01)
*C03B 23/20* (2006.01)

(52) U.S. Cl.
USPC ............... 250/504 R; 250/492.1; 250/492.2; 438/727; 438/795; 428/34; 428/34.4; 428/80; 362/321; 134/30; 134/35; 134/37; 134/102.1; 134/105

(58) Field of Classification Search
USPC ............ 250/365, 492.1, 492.2, 504 R, 505.1; 438/710, 727, 795, 798, 800, 907, 909; 428/34, 428/34.1, 34.4, 34.6, 36.6, 80; 501/53–55; 362/247, 290, 291, 292, 321, 345; 156/345.29, 156/345.33, 345.5; 134/1, 1.3, 2, 30, 37, 134/102.1, 105; 216/58, 60, 63, 66
See application file for complete search history.

(56) References Cited

U.S. PATENT DOCUMENTS

| | | | |
|---|---|---|---|
| 3,733,709 | A | 5/1973 | Bassemir et al. |
| 3,819,929 | A | 6/1974 | Newman |
| 3,894,343 | A | 7/1975 | Pray et al. |
| 3,967,385 | A | 7/1976 | Culbertson |
| 4,005,135 | A | 1/1977 | Helding |
| 4,005,138 | A | 1/1977 | Plattner et al. |
| 4,015,340 | A | 4/1977 | Treleven |
| 4,025,795 | A | 5/1977 | Lackore et al. |
| 4,049,987 | A | 9/1977 | Helms |
| 5,262,902 | A | 11/1993 | Okumura et al. |
| 5,470,799 | A | 11/1995 | Itoh et al. |
| 5,534,107 | A | 7/1996 | Gray et al. |
| 5,572,091 | A | 11/1996 | Langer et al. |

(Continued)

FOREIGN PATENT DOCUMENTS

| JP | 2002-016033 A | 1/2002 |
|---|---|---|
| KR | 10-0363846 B1 | 11/2002 |

OTHER PUBLICATIONS

International Search Report and Written Opinion mailed Feb. 17, 2012 for PCT/US2011/001032.

(Continued)

*Primary Examiner* — Bernard E Souw
(74) *Attorney, Agent, or Firm* — Buchanan Ingersoll & Rooney PC

(57) ABSTRACT

A quartz window with an interior plenum is operable as a shutter or UV filter in a degas chamber by supplying the plenum with an ozone-containing gas. Pressure in the plenum can be adjusted to block UV light transmission into the degas chamber or adjust transmittance of UV light through the window. When the plenum is evacuated, the plenum allows maximum transmission of UV light into the degas chamber.

9 Claims, 3 Drawing Sheets

U.S. PATENT DOCUMENTS

| | | | |
|---|---|---|---|
| 5,716,495 | A | 2/1998 | Butterbaugh et al. |
| 5,781,693 | A | 7/1998 | Ballance et al. |
| 5,788,940 | A | 8/1998 | Cicha et al. |
| 5,861,633 | A | 1/1999 | Mandellos |
| 5,922,219 | A | 7/1999 | Fayfield et al. |
| 6,012,304 | A | 1/2000 | Loxley et al. |
| 6,015,503 | A | 1/2000 | Butterbaugh et al. |
| 6,015,759 | A | 1/2000 | Khan et al. |
| 6,065,481 | A | 5/2000 | Fayfield et al. |
| 6,108,126 | A | 8/2000 | Hagiwara et al. |
| 6,156,079 | A | 12/2000 | Ho et al. |
| 6,187,133 | B1 | 2/2001 | Knoot |
| 6,191,428 | B1 | 2/2001 | Gilberti |
| 6,280,801 | B1 | 8/2001 | Schmitt |
| 6,355,587 | B1 | 3/2002 | Loxley et al. |
| 6,465,374 | B1 | 10/2002 | Butterbaugh et al. |
| 6,465,799 | B1 | 10/2002 | Kimble et al. |
| 6,649,921 | B1 | 11/2003 | Cekic et al. |
| 6,720,566 | B2 | 4/2004 | Blandford |
| 6,797,966 | B2 | 9/2004 | Summers et al. |
| 6,832,844 | B2 | 12/2004 | Guzorek |
| 6,843,202 | B2 | 1/2005 | Kusuda |
| 7,036,957 | B2 | 5/2006 | Paravantsos |
| 7,081,290 | B2 | 7/2006 | Takahashi et al. |
| 7,365,037 | B2 | 4/2008 | Sato et al. |
| 7,566,891 | B2 | 7/2009 | Rocha-Alvarez et al. |
| 7,589,336 | B2 | 9/2009 | Kaszuba et al. |
| 8,232,538 | B2 * | 7/2012 | Sant et al. ............ 250/504 R |
| 2001/0012604 | A1 | 8/2001 | Okase et al. |
| 2001/0034004 | A1 | 10/2001 | Kitamura |
| 2004/0203251 | A1 | 10/2004 | Kawaguchi et al. |
| 2005/0268467 | A1 | 12/2005 | Woods-Hunter |
| 2006/0196525 | A1 | 9/2006 | Vrtis et al. |
| 2007/0228618 | A1 | 10/2007 | Kaszuba et al. |
| 2007/0286963 | A1 | 12/2007 | Rocha-Alvarez et al. |
| 2008/0067425 | A1 | 3/2008 | Kaszuba et al. |
| 2008/1043806 | | 6/2008 | Claeys |
| 2009/0045714 | A1 | 2/2009 | Claeys |
| 2009/0065027 | A1 | 3/2009 | Kawamura et al. |
| 2011/0095207 | A1 * | 4/2011 | Sant et al. ............ 250/492.2 |
| 2011/0097900 | A1 | 4/2011 | Augustino et al. |
| 2011/0097902 | A1 * | 4/2011 | Singh et al. ............ 438/710 |
| 2011/0146705 | A1 * | 6/2011 | Hart et al. ............ 134/2 |
| 2011/0297900 | A1 * | 12/2011 | Cid-Aguilar et al. ...... 252/588 |

OTHER PUBLICATIONS

Carriere, L. A. et al., "Economics of Switching Fluorescent Lamps", IEEE Transactions on Industry Applications, vol. 24, No. 3, pp. 370-379, May/Jun. 1988 (IRC Paper No. 1562).

* cited by examiner

OZONE PLENUM AS UV SHUTTER OR TUNABLE UV FILTER FOR CLEANING SEMICONDUCTOR SUBSTRATES

BACKGROUND

During plasma processing of semiconductor substrates wherein the semiconductor substrates are exposed to halogen-containing process gases, a residue of the process gases, e.g. a residue containing bromine, can remain on surfaces of the semiconductor substrates. Such residue can cause defects in the semiconductor substrates in downstream processing steps, and can contaminate other semiconductor substrates in the processing pipeline. Therefore, it is desirable to remove such residue from the semiconductor substrates in a degas chamber.

SUMMARY

A quartz window of a degas chamber in which semiconductor substrates are cleaned with an ozone-containing gas under illumination of UV light, the quartz window comprising: a bottom surface, a top surface and a sidewall extending between the bottom surface and the top surface; a plenum between the top and bottom surfaces; and at least one gas passage in fluid communication with the plenum. The quartz window can be mounted over an opening in a top wall of the degas chamber. The plenum covers at least the entire area of the quartz window that overlies the opening. The plenum can be supplied with an ozone-containing gas with a suitable ozone partial pressure to block and/or tune UV light transmission through the quartz window.

DETAILED DESCRIPTION

Described herein is a quartz window with a gas plenum between upper and lower surfaces thereof to function as a UV shutter or adjustable UV filter. In one embodiment, the quartz window with a plenum is identical in outside dimensions and shape as, and mounted on a degas chamber the same way as, the quartz window disclosed in commonly assigned U.S. patent application Ser. No. 12/607,659, the disclosure of which is hereby incorporated by reference.

Figure 1:
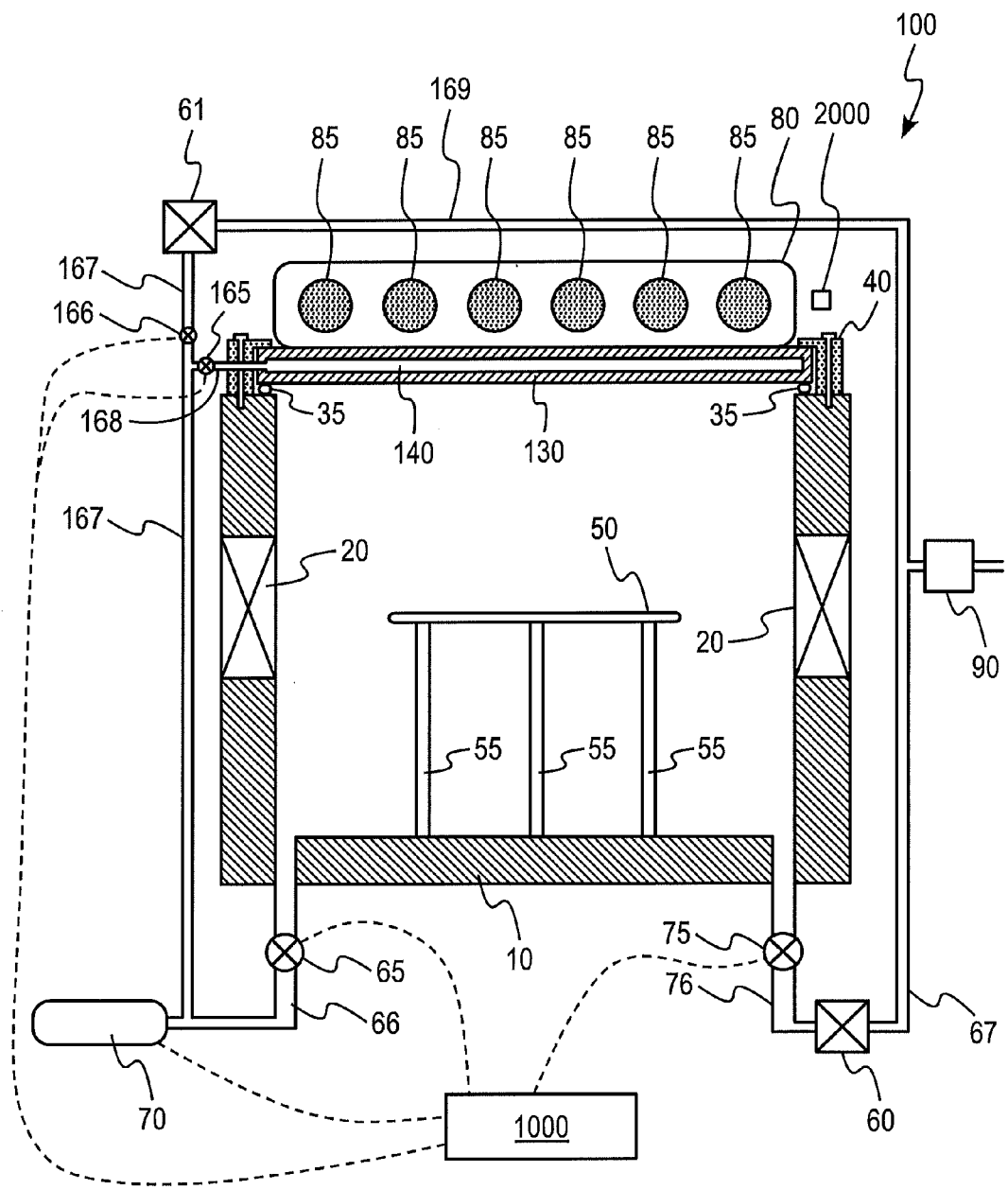
FIG. 1 shows a schematic cross section of a degas chamber with a quartz window according to an embodiment.

As shown in FIG. 1, a degas chamber 100 comprises a vacuum chamber wall 10, made of a metallic material such as aluminum. A quartz window 130 is clamped to a top wall of the chamber wall 10 by any suitable arrangement such as a plurality of clamps 40 so as to overlie a top opening in the top wall larger than a semiconductor substrate such as a wafer to be cleaned in the chamber. The quartz window 130 is preferably made of synthetic quartz for its high transmission of UV light. Synthetic quartz is typically untwinned and produced in an autoclave via the hydrothermal process. A continuous O-ring 35 between the quartz window 130 and the chamber wall 10 provides a vacuum seal. A UV lamp assembly 80 is disposed above the quartz window 130, the UV lamp assembly 80 comprising a plurality of parallel UV lamps 85.

The quartz window 130 is configured to be mounted on the top of the degas chamber 100 in which UV light from the UV lamp assembly 80 can transmit through the quartz window 130 while ozone gas is flowed in the degas chamber 100 to remove halogen-containing residues from a semiconductor substrate 50 such as a 300 mm wafer supported in the degas chamber 100.

During processing in the degas chamber 100, the degas chamber 100 is evacuated by a vacuum pump 60 and the semiconductor substrate 50 is transferred through a loading door 20 in the chamber wall 10 and placed on a suitable support such as a plurality of substrate support pins 55. An ozone-containing gas flows from an ozone source 70 into the degas chamber 100. The gas preferably contains a small amount of nitrogen gas (e.g. 0.1 to 0.5 wt %). The gas pressure in the degas chamber 100 is preferably maintained from 100 mTorr to 10 Torr, more preferably from 0.5 to 1.5 Torr, with an ozone partial pressure preferably from 0.0005 to 1 Torr, more preferably from 0.0025 to 0.33 Torr, most preferably from 0.05 to 0.08 Torr. The UV lamp assembly 80 irradiates the semiconductor substrate 50 through the quartz window 130 with UV light preferably of a wavelength of 254 nm and intensity between 0.05 and 5 W/cm$^2$, for a period of 10 seconds to 1 minute. Ozone gas absorbs UV light and decomposes into O radicals (atomic oxygen) which react with halogen-containing residues such as bromine or chlorine on the semiconductor substrate 50. The reaction products are gaseous and are evacuated from the degas chamber 100 by the vacuum pump 60.

During a process of transporting the semiconductor substrate 50 into and out from the degas chamber 100, it is desirable to block UV light of the UV lamp assembly 80 from entering the degas chamber 100. However, to minimize delay in processing substrates and to prevent premature failure of UV lamps 85, it is desirable that UV lamps 85 in the UV lamp assembly 80 remain powered rather than being switched on and off for each substrate transport.

In a first embodiment as shown in FIG. 1, the quartz window 130 in a degas chamber 100 has a plenum 140 in an interior. The plenum 140 at least covers an opening in the top wall through which UV light from the UV lamp assembly 80 passes into the chamber 100. The ozone source 70 is connected to the degas chamber 100 through a gas line 66, gas flow through which can be controlled by a valve 65. The degas chamber 100 is connected to an inlet of the vacuum pump 60 through a gas line 76, gas flow through which can be controlled by a valve 75. An outlet of the vacuum pump 60 is connected via a gas line 67 to an ozone destroying unit 90. The ozone destroying unit 90 is operable to destroy ozone (e.g. by converting ozone to oxygen gas) in gas flowing therethrough before releasing the gas to the atmosphere. The ozone source 70 is also connected to an inlet of another vacuum pump 61 through a gas line 167, gas flow through which can be controlled by a valve 166. The plenum 140 is connected to an inlet of the vacuum pump 61 through a gas line 168, which branches off line 167, and gas flow through which can be controlled by a valve 165. An outlet of the vacuum pump 61 is connected via a gas line 169 to the ozone destroying unit 90.

The plenum 140 can be supplied with a suitable amount of ozone-containing gas effective to absorb UV light from the UV lamps 85 when UV light is not needed in the degas chamber 100, such as during the process of transporting the substrate 50 into and out of the degas chamber 100. When UV light is needed for a degas process, the plenum 140 is evacuated to allow UV light from the UV lamps 85 to pass through the quartz window 130 and reach the interior of the degas chamber 100. The valves can be flow control valves which can close or open to a range of valve positions to control flow rate therethrough. A controller 1000 is operable to close valves 166, 165, 65 and 75 and adjust valve positions of valves 166, 165, 65 and 75, adjust the ozone source 70 and gas pressure in the plenum 140 and the chamber 100.

Figure 2:
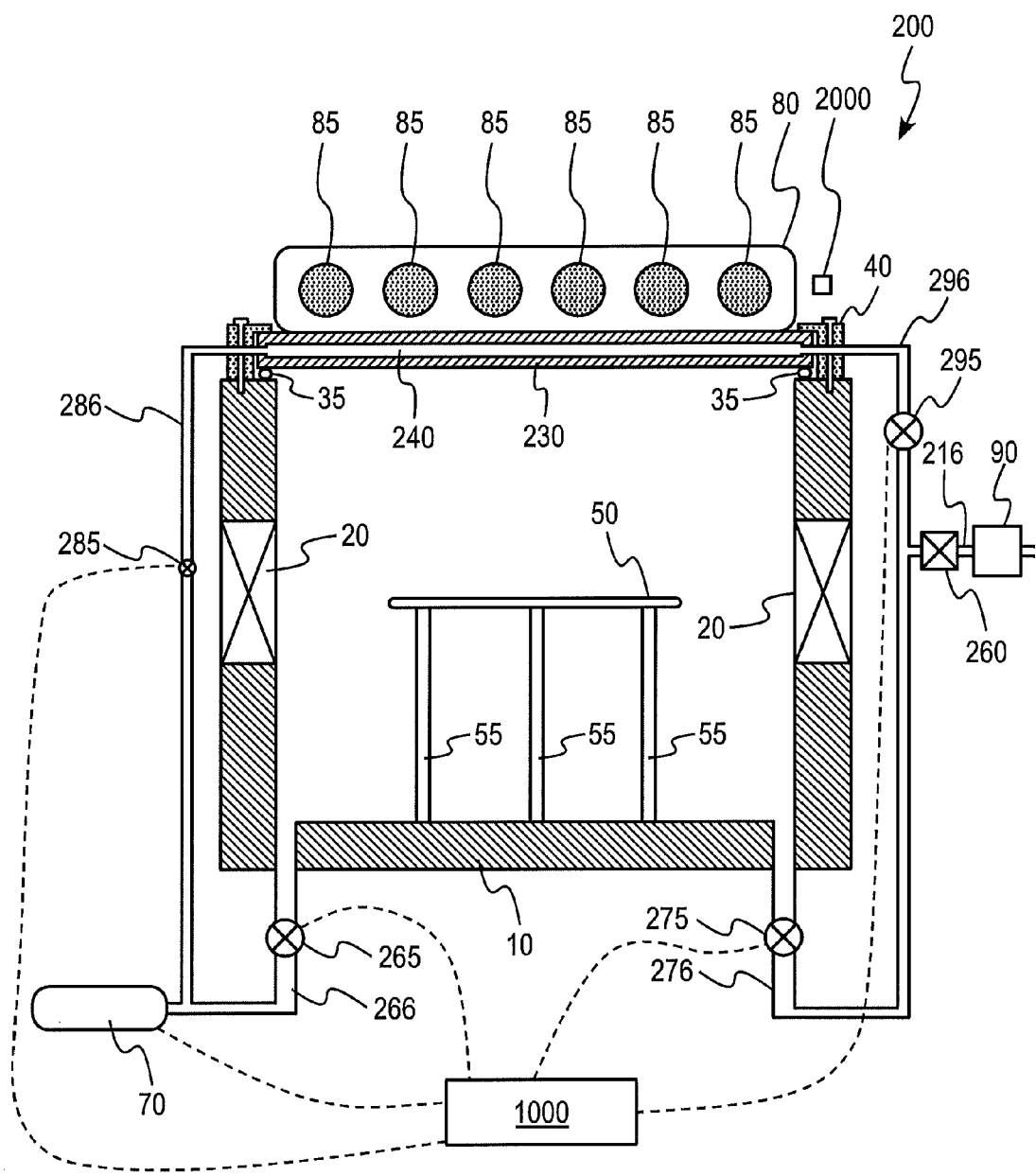
FIG. 2 shows a schematic cross section of a degas chamber with a quartz window according to another embodiment.

In a second embodiment as shown in FIG. 2, the quartz window 230 in a degas chamber 200 has a plenum 240 in an interior. The plenum 240 at least covers an opening in the top wall through which UV light from the UV lamp assembly 80 passes into the chamber 200. The ozone source 70 is connected to the degas chamber 200 through a gas line 266, gas flow through which can be controlled by a valve 265. The degas chamber 200 is connected to an inlet of the vacuum pump 260 through a gas line 276, gas flow through which can be controlled by a valve 275. An outlet of the vacuum pump 260 is connected via a gas line 216 to the ozone destroying unit 90. The ozone source 70 is also connected to an inlet of the plenum 240 through a gas line 286, gas flow through which can be controlled by a valve 285. An outlet of the plenum 240 is connected to the pump 260 through a gas line 296, gas flow through which can be controlled by a valve 295.

The plenum 240 can be supplied with a suitable amount of ozone-containing gas effective to absorb UV light from the UV lamps 85 when UV light is not needed in the degas chamber 200, such as during the process of transporting the substrate 50 into and out of the degas chamber 200. When UV light is needed for a degas process, the plenum 240 is evacuated to allow UV light from the UV lamps 85 to pass through the quartz window 230 and reach the interior of the degas chamber 200. The valves can be flow control valves which can close or open to a range of valve positions to control flow rate therethrough. A controller 1000 is operable to close valves 285, 265, 275 and 295 and adjust valve positions of valves 285, 265, 275 and 295, adjust the ozone source 70 and gas pressure in the plenum 240 and the chamber 200.

Transmittance of UV light through the plenum 140/240 can be calculated by the Beer-Lambart Law:

$$\frac{I_t}{I_0} = e^{-cPd} \quad \text{(Eq. 1)}$$

Wherein $I_0$ is intensity of UV light before entering the plenum 140/240; $I_t$ is intensity of transmitted UV light through the plenum 140/240; P is partial pressure of ozone gas in the plenum 140/240; c is a constant of about 130/atm/cm for UV light with a wavelength of 254 nm; and d is a height of the plenum 140/240 through which UV light passes to reach the interior of the chamber 100/200.

Figure 3:
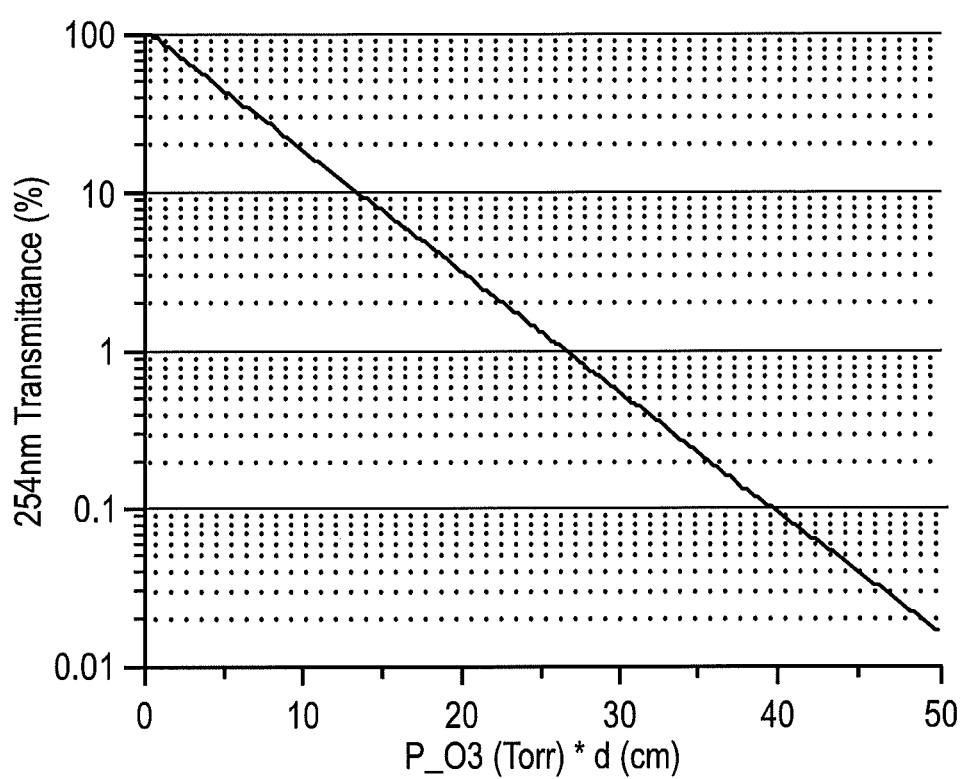
FIG. 3 shows UV (254 nm wavelength) transmittance through a plenum as a function of the product of ozone partial pressure therein and a height thereof.

FIG. 3 shows dependence of UV transmittance at 254 nm wavelength through the plenum 140/240 on the product of P and d, according to Eq. 1. The x axis is the product of P and d. The y axis is transmittance of UV light at 254 nm wavelength. From FIG. 3 and Eq. 1, desired ozone partial pressure P in the plenum 140/240 can be deduced from the height d of the plenum 140/240 and desired transmittance. For example, if 0.1% transmittance is desired, and the height d is 1 cm, then desired ozone partial pressure P is about 40 Torr. The product of P and d is preferably from 4 to 53 cm·Torr. An upper wall and a lower wall of the quartz window 130/230 that enclose the plenum 140/240 have thicknesses sufficient to withstand pressure differences between the vacuum pressure in the plenum 140/240, the vacuum pressure in the chamber 100/200 and atmosphere pressure pressing on the outside of the window. Preferably the upper wall and the lower wall each have a thickness of at least 5 mm, preferably at least 9 mm.

A cycle of an exemplary degas process comprises: (a) transporting the semiconductor substrate 50 into the degas chamber 100/200; (b) supplying the interior of the degas chamber 100/200 with an ozone-containing gas with a suitable ozone partial pressure (e.g. 0.0005 to 1 Torr); (c) evacuating the plenum 140/240; (d) generating O radicals in the chamber by irradiating the ozone-containing gas in the degas chamber 100/200 with UV light directed into the chamber by a UV light assembly 80 through the quartz window 130/230; (e) forming volatile byproducts by reacting halogen-containing residues on the semiconductor substrate 50 with the O radicals for a suitable time period (e.g. 15 sec-60 sec) and evacuating the volatile byproducts from the chamber; (f) supplying the ozone-containing gas to the plenum 140/240 and adjusting ozone partial pressure in the plenum 140/240 with the controller 1000 to essentially block the UV light from the UV light assembly 80 (e.g. with transmittance of no more than 0.1% through the quartz window 130/230); (g) evacuating the degas chamber 100/200; (h) transporting the semiconductor substrate 50 out of the degas chamber 100/200; (i) repeating steps (a)-(h) with another semiconductor substrate.

In the first embodiment, the controller 1000 can be used to control the valves to supply gas to and evacuate gas from the degas chamber 100 and the plenum 140 in the exemplary degas process above. For example: (a) closing the valves 65, 75 and 166, opening the valve 165 with the controller 1000 to supply the ozone-containing gas to the plenum 140 and adjusting ozone partial pressure in the plenum 140 with the controller 1000 to essentially block the UV light; (b) maintaining valve 65 closed and closing valve 165, opening valves 75 and 166 with the controller 1000 to evacuate the degas chamber 100; (c) transporting a semiconductor substrate into the degas chamber 100; (d) maintaining valve 65 closed, maintaining valves 166 and 75 open, and opening valve 165 with the controller 1000 to evacuate the plenum 140; (e) maintaining valve 75 open, and closing valves 166 and 165, opening the valve 65 with the controller 1000 to supply the degas chamber 100 with an ozone-containing gas; (f) generating O radicals in the chamber 100 by irradiating the ozone-containing gas in the degas chamber 100 with UV light through the quartz window 130; (g) forming volatile byproducts by reacting halogen-containing residues on the semiconductor substrate with the O radicals for a time period (e.g. 15 sec-60 sec) and evacuating the volatile byproducts from the chamber 100; (h) maintaining valve 166 closed, closing valves 65, 75 and opening the valve 165 with the controller 1000 to supply the ozone-containing gas to the plenum 140 and adjusting ozone partial pressure in the plenum 140 with the controller 1000 to essentially block the UV light; (i) maintaining valve 65 closed, closing valve 165, opening the valves 75 and 166, with the controller 1000 to evacuate the degas chamber 100; (j) transporting the semiconductor substrate out of the degas chamber 100; (k) repeating steps (a)-(j) with another semiconductor substrate.

In the second embodiment, the controller 1000 can be used to control the valves to supply gas to and evacuate gas from the degas chamber 200 and the plenum 240 in the exemplary degas process above. For example: (a) closing the valve 265, opening the valves 275, 285 and 295 with the controller 1000 to evacuate the degas chamber 200 and to supply the ozone-containing gas to the plenum 240 and adjusting ozone partial pressure in the plenum 240 with the controller 1000 to essentially block the UV light; (b) transporting a semiconductor substrate into the degas chamber 200; (c) closing the valve 285, maintaining valves 275 and 295 open and opening valve 265 with the controller 1000 to supply the degas chamber 200 with an ozone-containing gas and to evacuate the plenum

240; (d) generating O radicals in the chamber 200 by irradiating the ozone-containing gas in the degas chamber 200 with UV light through the quartz window 230; (e) forming volatile byproducts by reacting halogen-containing residues on the semiconductor substrate with the O radicals for a time period (e.g. 15 sec-60 sec) and evacuating the volatile byproducts from the chamber 200; (f) closing the valve 265, maintaining valves 275 and 295 open and opening valve 285 with the controller 1000 to evacuate the degas chamber 200 and to supply the ozone-containing gas to the plenum 240 and adjusting ozone partial pressure in the plenum 240 with the controller 1000 to essentially block the UV light, and then (g) transporting the semiconductor substrate out of the degas chamber 200; (h) repeating steps (a)-(g) with another semiconductor substrate.

By adjusting the ozone partial pressure P in the plenum 140/240, transmittance through the quartz window 130/230 can be tuned, i.e. the quartz window 130/230 can be functional as a tunable UV filter.

A cycle of another exemplary degas process comprises: (a) transporting the semiconductor substrate 50 into the degas chamber 100/200; (b) supplying the degas chamber 100/200 with an ozone-containing gas with a suitable ozone partial pressure (e.g. 0.0005 to 1 Torr); (c) adjusting the ozone partial pressure in the plenum 140/240 such that UV light transmittance through the quartz window 130/230 reaches a desired value; (d) generating O radicals in the chamber by irradiating the ozone-containing gas in the degas chamber 100/200 with UV light directed into the chamber by the UV light assembly 80 through the quartz window 130/230; (e) forming volatile byproducts by reacting halogen-containing residues on the semiconductor substrate 50 with the O radicals for a suitable time period (e.g. 15 sec-60 sec) and evacuating the volatile byproducts from the chamber; (f) adjusting the ozone partial pressure in the plenum 140/240 to essentially block the UV light (e.g. with transmittance of no more than 0.1% through the quartz window 130/230); (g) evacuating the degas chamber 100/200; (h) transporting the semiconductor substrate 50 out of the degas chamber 100/200; (i) repeating steps (a)-(h) with another semiconductor substrate.

The quartz window 130/230 can also be used to compensate for reduction of UV light radiant flux (i.e. total power of UV radiation) from the UV lamp assembly 80 as the UV lamps 85 age.

A cycle of yet another exemplary degas process comprises: (a) transporting the semiconductor substrate 50 into the degas chamber 100/200; (b) measuring UV light radiant flux from the UV lamp assembly 80 with a UV light sensor 2000; (c) supplying the degas chamber 100/200 with an ozone-containing gas with a suitable ozone partial pressure (e.g. 0.0005 to 1 Torr); (d) adjusting with the controller 1000 the ozone partial pressure in the plenum 140/240 based on the measured UV light radiant flux to compensate for changes of the UV light radiant flux from the UV lamp assembly 80 such that UV light radiant flux through the quartz window 130/230 is adjusted to a desired value; (e) generating O radicals in the chamber by irradiating the ozone-containing gas in the degas chamber 100/200 with UV light directed into the chamber by the UV light assembly 80 through the quartz window 130/230; (f) forming volatile byproducts by reacting halogen-containing residues on the semiconductor substrate 50 with the O radicals for a suitable time period (e.g. 15 sec-60 sec) and evacuating the volatile byproducts from the chamber; (g) adjusting the ozone partial pressure in the plenum 140/240 with the controller 1000 to essentially block the UV light (e.g. with transmittance of no more than 0.1% through the quartz window 130/230); (h) evacuating the degas chamber 100/200; (i) transporting the semiconductor substrate 50 out of the degas chamber 100/200; (j) repeating steps (a)-(i) with another semiconductor substrate.

The plenum 140/240 can be made by various manufacturing techniques. For example, the plenum 140/240 can be made by fusing two quartz plates having the plenum and at least one passage communicating with the plenum machined therein together, or by mechanically clamping two quartz plates together with a resilient seal ring (e.g. rubber o-ring) sandwiched therebetween to form plenum 140/240. The passage communicating with the plenum formed by the O-ring can be drilled through the outer plate and suitable connections can be provided to the ozone-supplying and vacuum lines. The plates need to have thicknesses suitable to withstand the vacuum force acting on the inside of the window 130/230 due to the vacuum in the chamber and atmospheric pressure acting on the outside of the window 130/230.

Advantages of the quartz window 130/230 with an interior plenum 140/240 include use of the quartz window 130/230 as a UV shutter or an adjustable UV filter without any mechanical moving parts or actuation mechanism that can occupy valuable space above the quartz window 130/230 and/or be unreliable after repeated use. In addition, because the quartz window 130/230 lacks mechanical moving parts and an actuation mechanism, the UV lamps 85 can be placed very close to the quartz window 130/230 and thus enhances UV light intensity at the substrate surface in the degas chamber 100/200.

While the quartz window 130/230 with the plenum 140/240 has been described in detail with reference to specific embodiments thereof, it will be apparent to those skilled in the art that various changes and modifications can be made, and equivalents employed, without departing from the scope of the appended claims. For example, the quartz window can have any suitable shape to accommodate different designs of a degas chamber; the shape and location of the plenum in the quartz window can vary as long as the plenum covers substantially the entire area of the quartz window that is exposed to UV light from the UV lamps.

We claim:

1. A quartz window of a degas chamber in which semiconductor substrates are cleaned with an ozone-containing gas under illumination of UV light, the quartz window comprising:
    a bottom surface, a top surface and a sidewall extending between the bottom surface and the top surface;
    a plenum between the top and bottom surfaces; and
    at least one gas passage in fluid communication with the plenum.

2. The quartz window of claim 1, wherein the quartz is synthetic quartz and/or the quartz window includes a first gas passage in fluid communication with the plenum operative to allow supply of the ozone-containing gas to the plenum and a second gas passage in fluid communication with the plenum operative to allow evacuation of the plenum.

3. The quartz window of claim 1, wherein the plenum is located between two quartz plates with a vacuum seal therebetween defining the plenum, a pair of quartz plates bonded together and machined with the plenum between opposed surfaces of the plates, or a pair of quartz plates bonded to a quartz ring defining the plenum between opposed surfaces of the plates and inwardly of the ring.

4. A degas chamber comprising:
    the quartz window of claim 1 removably mounted over an opening in a top wall of the degas chamber; and
    a UV lamp assembly disposed above the quartz window.

5. The degas chamber of claim 4, wherein:
an ozone source is in fluid communication with the at least one gas passage through a first branch of a branched gas line, gas flow through the first branch controlled by a first valve, the ozone source operable to supply an ozone-containing gas to the plenum;
the ozone source is in fluid communication with an inlet of a first vacuum pump through a second branch of the branched gas line, gas flow through the second branch controlled by a second valve, the first vacuum pump operable to evacuate the plenum;
an ozone destroying unit in fluid communication with an outlet of the first vacuum pump through a third gas line, the ozone destroying unit operable to destroy ozone flowing therethrough;
the ozone source is in fluid communication with the degas chamber through a fourth gas line, gas flow through the fourth gas line controlled by a fourth valve, the ozone source operable to supply an ozone-containing gas to the degas chamber;
the degas chamber is in fluid communication with the inlet of the second vacuum pump through a fifth gas line, gas flow through the fifth gas line controlled by a fifth valve, the second vacuum pump operable to evacuate the degas chamber; and
an outlet of the second vacuum pump is in fluid communication with the ozone destroying unit through a sixth gas line;
the degas chamber further comprising a controller operable to control the first, second, fourth, and fifth valves, the ozone source and/or gas pressure in the plenum and in the degas chamber.

6. The degas chamber of claim 4, wherein the quartz window is removably mounted by a plurality of clamps, and an O-ring disposed between the quartz window and the upper surface of the degas chamber to provide a vacuum seal.

7. The degas chamber of claim 4, wherein the plenum covers the entire opening in the top wall through which the semiconductor substrate is exposed to UV light from the UV lamp assembly.

8. A degas chamber comprising:
the quartz window of claim 2 removably mounted over an opening in a top wall of the degas chamber; and
a UV lamp assembly disposed above the quartz window.

9. The degas chamber of claim 8, wherein:
an ozone source is in fluid communication with the first gas passage through a first gas line, gas flow through the first gas line controlled by a first valve, and in fluid communication with the degas chamber through a second gas line, gas flow through the second gas line controlled by a second valve, the ozone source operable to supply an ozone-containing gas to the plenum and/or the degas chamber;
the second gas passage is in fluid communication with an inlet of a vacuum pump through a third gas line, gas flow through the third gas line controlled by a third valve, the vacuum pump operable to evacuate the plenum;
the degas chamber is in fluid communication with the inlet of the vacuum pump through a fourth gas line, gas flow through the fourth gas line controlled by a fourth valve, the vacuum pump operable to evacuate the degas chamber;
an ozone destroying unit in fluid communication with an outlet of the vacuum pump through a fifth gas line, the ozone destroying unit operable to destroy ozone flowing therethrough; and
the degas chamber further comprising a controller operable to control the first, second, third and fourth valves, the ozone source and/or gas pressure in the plenum and in the degas chamber.

* * * * *